(12) United States Patent
Färm et al.

(10) Patent No.: US 9,223,203 B2
(45) Date of Patent: Dec. 29, 2015

(54) MICROCONTACT PRINTED FILMS AS AN ACTIVATION LAYER FOR SELECTIVE ATOMIC LAYER DEPOSITION

(75) Inventors: Elina Färm, Helsinki (FI); Seppo Lindroos, Helsinki (FI); Mikko Ritala, Espoo (FI); Markku Leskelä, Espoo (FI)

(73) Assignee: ASM INTERNATIONAL N.V., Almere (NL)

( * ) Notice: Subject to any disclaimer, the term of this patent is extended or adjusted under 35 U.S.C. 154(b) by 0 days.

(21) Appl. No.: 13/178,969

(22) Filed: Jul. 8, 2011

(65) Prior Publication Data
US 2013/0011557 A1    Jan. 10, 2013

(51) Int. Cl.
| | | |
|---|---|---|
| *C23C 16/00* | (2006.01) | |
| *G03F 7/00* | (2006.01) | |
| *C23C 16/04* | (2006.01) | |
| *C23C 16/06* | (2006.01) | |
| *C23C 16/02* | (2006.01) | |
| *B82Y 10/00* | (2011.01) | |
| *B82Y 40/00* | (2011.01) | |

(52) U.S. Cl.
CPC ............. *G03F 7/0002* (2013.01); *B82Y 10/00* (2013.01); *B82Y 40/00* (2013.01); *C23C 16/0272* (2013.01); *C23C 16/04* (2013.01); *C23C 16/06* (2013.01)

(58) Field of Classification Search
CPC ...... C23C 14/024; C23C 14/04; C23C 14/08; C23C 16/00; C23C 16/0272; C23C 16/04; C23C 16/40
USPC ...................................................... 427/248.1
See application file for complete search history.

(56) References Cited

U.S. PATENT DOCUMENTS

| | | | |
|---|---|---|---|
| 4,539,061 | A | 9/1985 | Sagiv |
| 4,756,971 | A | 7/1988 | Virtanen et al. |
| 5,350,480 | A | 9/1994 | Gray |
| 5,479,727 | A | 1/1996 | Fine et al. |
| 5,591,494 | A | 1/1997 | Sato et al. |
| 5,647,953 | A | 7/1997 | Williams et al. |
| 5,728,629 | A | 3/1998 | Mizuno et al. |
| 6,071,573 | A | 6/2000 | Koemtzopoulos et al. |
| 6,162,499 | A | 12/2000 | Sandhu et al. |
| 6,316,052 | B1 | 11/2001 | Shiokawa |

(Continued)

FOREIGN PATENT DOCUMENTS

| | | |
|---|---|---|
| EP | 0 844 028 | 5/1998 |
| JP | 2001-20075 | 1/2001 |

(Continued)

OTHER PUBLICATIONS

Chen et al. Chemistry for positive pattern transfer using area-selective atomic layer deposition, 2006, Adv. Mater. 18, pp. 1086-1090.*

(Continued)

*Primary Examiner* — Kelly M Gambetta
(74) *Attorney, Agent, or Firm* — Knobbe, Martens, Olson & Bear, LLP (57) ABSTRACT

The present application relates to methods of forming patterned thin films on a substrate. In some embodiments a first patterned layer may be deposited on a substrate by a imprint lithography technique, such as microcontact printing. A second layer of a desired composition is selectively deposited over the first patterned layer by a vapor phase deposition process, such as ALD or CVD.

17 Claims, 10 Drawing Sheets

---

Print a first patterned layer on the substrate by microcontact printing

Selectively deposit a second layer on the activation layer by a vapor deposition process

(56) References Cited

U.S. PATENT DOCUMENTS

| | | | |
|---|---|---|---|
| 6,365,420 | B2 | 4/2002 | Ashida |
| 6,391,785 | B1 | 5/2002 | Satta et al. |
| 6,416,577 | B1 | 7/2002 | Suntoloa et al. |
| 6,468,903 | B2 | 10/2002 | Bolscher et al. |
| 6,537,461 | B1 | 3/2003 | Nakahara et al. |
| 6,562,140 | B1 | 5/2003 | Bonestam et al. |
| 6,664,192 | B2 | 12/2003 | Satta et al. |
| 6,720,259 | B2 | 4/2004 | Londergan et al. |
| 6,767,582 | B1 | 7/2004 | Elers |
| 6,890,596 | B2 | 5/2005 | Sarigiannis et al. |
| 7,045,170 | B1 | 5/2006 | Hankins et al. |
| 7,118,779 | B2 | 10/2006 | Verghese et al. |
| 7,666,773 | B2 | 2/2010 | Huotari et al. |
| 7,799,135 | B2 | 9/2010 | Verghese et al. |
| 7,914,847 | B2 | 3/2011 | Verghese et al. |
| 2002/0018849 | A1 | 2/2002 | George et al. |
| 2002/0022265 | A1 | 2/2002 | Bailey et al. |
| 2004/0023516 | A1 | 2/2004 | Londergan et al. |
| 2004/0033639 | A1 | 2/2004 | Chinn et al. |
| 2004/0134427 | A1 | 7/2004 | Derderian et al. |
| 2005/0012975 | A1 | 1/2005 | George |
| 2005/0037135 | A1 | 2/2005 | Zhu |
| 2006/0040054 | A1 | 2/2006 | Pearlstein et al. |
| 2006/0108320 | A1 | 5/2006 | Lazovsky |
| 2007/0098894 | A1 | 5/2007 | Verghese et al. |
| 2007/0190362 | A1* | 8/2007 | Weidman ............... 428/701 |
| 2008/0081151 | A1 | 4/2008 | Kobrin et al. |
| 2008/0105979 | A1 | 5/2008 | Whelan |
| 2008/0113178 | A1 | 5/2008 | Lazovsky |
| 2009/0191355 | A1* | 7/2009 | Lee et al. ............... 427/535 |

FOREIGN PATENT DOCUMENTS

| | | |
|---|---|---|
| WO | WO 01/27346 | 4/2001 |
| WO | WO 01/40541 | 6/2001 |
| WO | WO 02/088421 | 11/2002 |
| WO | WO 2004/063421 | 7/2004 |

OTHER PUBLICATIONS

Chen et al., "Surface Modification for Area-selective Atomic Layer Deposition," NSF/SRC Engineering Research Center for Environmentally Benign Semiconductor Manufacturing, pp. 1-33 (2003).

Farm et al., "Selective-Area Atomic Layer Deposition Using Poly(methyl methacrylate) Films as Mask Layers", J. Phys. Chem. C, 2008, vol. 112, pp. 15791-15795.

Farm et al., "Selective-Area Atomic Layer Deposition Using Poly-(vinyl pyrrolidone) as a Passivation Layer", Journal of the Electrochemical Society, 2010, vol. 157, No. 1, pp. K10-K14.

Gupta et al, "Nanometer spaced electrodes using selective area atomic layer deposition", Applied Physics Letters, 2007, vol. 90, 253102.

Herrmann et al., "Conformal Hydrophobic Coatings Prepared Using Atomic Layer Deposition Seed Layers and Non-Chlorinated Hydrophobic Precursors", Journal of Micromechanics and Microengineering, vol. 15, 2005, pp. 1-9.

International Search Report and Written Opinion mailed Dec. 22, 2011 in Application No. PCT/US2011/024762, filed Feb. 14, 2011.

Jiang et al., "Area-Selective ALD with Soft Lithographic Methods: Using Self-Assembled Monolayers to Direct Film Deposition", J. Phys. Chem. C, 2009, vol. 113, pp. 17613-17625.

Mackus et al., "Local deposition of high-purity Pt nanostructures by combining electron beam induced deposition and atomic layer deposition", Journal of Applied Physics, 2010, vol. 107, 116102.

Mackus et al., "Nanopatterning by direct-write atomic layer deposition", Nanoscale, 2012, vol. 4, pp. 4477-4480.

Mui et al., "Surface Modification for Selective Atomic Layer Deposition of High-κ Dielectric Materials," NSF/SRC Engineering Research Center for Environmentally Benign Semiconductor Manufacturing, pp. 1-21 (2002).

Sinha et al., "Area selective atomic layer deposition of titanium dioxide: Effect of precursor chemistry", J. Vac. Sci. Technol. B, Nov./Dec. 2006, vol. 24, No. 6, pp. 2523-2532.

Sinha et al., "Area-Selective ALD of Titanium Dioxide Using Lithographically Defined Poly(methyl methacrylate) Films", J. Electrochem. Soc., 2006, vol. 153, No. 5, pp. G465-G469.

Schmohl et al., "Functionalization of oxidized silicon surfaces with methyl groups and their characterization," Superlattices and Microstructures, Sep. 15, 2004, Superlattices and Microstructures 36 (2004), pp. 113-121, Elsevier Ltd.

Yang et al., Selective Chemical Vapor Deposition-Grown Ru for Cu Interconnect Capping Applications, Electrochem. Solid-State Lett., 2010, vol. 13, No. 5, pp. D33-D35.

\* cited by examiner

MICROCONTACT PRINTED FILMS AS AN ACTIVATION LAYER FOR SELECTIVE ATOMIC LAYER DEPOSITION

PARTIES OF JOINT RESEARCH AGREEMENT

The invention claimed herein was made by, or on behalf of, and/or in connection with a joint research agreement between the University of Helsinki and ASM Microchemistry Oy signed on Nov. 14, 2003 and renewed in 2008. The agreement was in effect on and before the date the claimed invention was made, and the claimed invention was made as a result of activities undertaken within the scope of the agreement.

BACKGROUND OF THE INVENTION

1. Field of the Invention

The present application relates to selective deposition of patterned thin films on substrates. Such films find use, for example, in integrated circuits.

2. Description of the Related Art

Atomic layer deposition (ALD) processes grow thin films through surface reactions between alternately supplied gaseous precursors. Examples of these types of processes are described in detail in U.S. Pat. Nos. 4,058,430 and 5,711,811. The films typically grow on a substrate surface layer by layer and the film thickness and composition can be controlled with atomic layer accuracy in the growth direction. The ALD technique allows for deposition of conformal and uniform films over large areas.

Film growth can also be controlled on the surface with selective deposition processes, such as selective-area ALD. Selective-area ALD is done typically so that the designated areas of the surface are passivated or protected against ALD precursors, in which case the film is deposited only on desired parts of the surface. This can be done using self-assembled monolayers (SAMs) that passivate the surface against ALD growth or by using polymer films that passivate or protect the surface against ALD growth.

Activation of a surface for deposition is a new approach to selective-area ALD. Contrary to surface passivation, ALD growth occurs on activated areas of the surface. This can be done by preparing a patterned catalytic layer that can be for example noble metal. The ALD film is then deposited only on the catalytic layer while rest of the substrate surface will remain free of an ALD film. So far selective-area ALD of platinum has been done using patterned platinum made by electron beam induced deposition as a catalytic layer. Mackus, A. J. M.; Mulders, J. J. L.; van de Sanden, M. C. M.; Kessels, W. M. M. J. Appl. Phys. 2010, 107, 116102. Sputtered palladium film has been used as nucleation layer for ALD copper films. Gupta, R.; Willis, B. G. *Appl. Phys. Lett.* 2007, 90, 253102 In this case the copper film was deposited only on palladium, not on $SiO_2$. Ruthenium films have been deposited selectively by chemical vapor deposition on a copper surface while no growth occurred on dielectric. Yang, C.-.; McFeely, F. R.; Wang, P.-.; Chanda, K.; Edelstein, D. C. Electrochem. Solid. St. 2010, 13, D33-D35.

Microcontact printing is a known technique for depositing films on the surface of a substrate. Previously microcontact printing has been used for depositing patterned passivation layers (SAM's, Thiols, etc) on a substrate.

SUMMARY OF THE INVENTION

In some embodiments, methods for selectively depositing a thin film on a substrate are provided herein. The methods include printing a first patterned layer on the substrate by microcontact printing; and subsequently selectively depositing a second layer on the activation layer by a vapor deposition process.

In some embodiments methods for depositing a patterned thin film are provided herein. The methods include depositing a patterned activation layer on a substrate; and depositing a second layer on the patterned activation layer by a vapor deposition process, wherein the second layer is selectively deposited on the patterned activation layer.

DETAILED DESCRIPTION

Selective-area vapor deposition of a film with a desired composition can be carried out by forming a patterned activation layer on a portion of a substrate and subsequently depositing the desired film selectively over the activation layer. For example, microcontact printing or other methods can be used to deposit an activation layer in a desired pattern on a substrate. Following deposition of the activation layer, a film with a desired composition and thickness is selectively deposited by a vapor deposition process, preferably by chemical deposition methods in vapor phase, such as ALD or CVD. The reactants used in the vapor deposition process react preferentially with the activation layer relative to the remainder of the substrate, such that the desired film is selectively formed on top of the patterned activation layer. Thus, the desired film is formed having the desired pattern.

In some embodiments a method for forming a thin film of a desired composition in a pattern on a substrate comprises:

Optionally treating the substrate surface to facilitate deposition of an activation material;

Forming a layer of activation material on the substrate in a desired pattern by microcontact printing or other lithographic technique comprising coating a patterned stamp with an activation material and contacting the substrate with the coated stamp such that a layer of activation material comprising the pattern of the stamp is formed on the substrate surface;

Converting the activation material to an activation layer, if necessary; and

Selectively depositing a film of a desired composition and thickness over the activation material, such that the film maintains the pattern of the underlying activation layer.

The substrate on which the patterned film is to be formed can comprise various types of materials. When manufacturing integrated circuits, the substrate typically comprises a number of thin films with varying chemical and physical properties. In some embodiments, at least one surface comprises a semiconductor, semiconductor oxide, semiconductor nitride, metal, metal oxide or metal nitride. For example, a surface may comprise a noble metal, silicon, polysilicon, SiGe, Ge, GaAs, silicon oxide or a silicon nitride, such as silicon oxynitride. The substrate may comprise a high-k dielectric layer. Exemplary high-k materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT. In some embodiments the activation layer comprises a metal, metal oxide, metal carbide, metal boride or metal nitride selected from the group consisting of Ta, TaN, $TaC_x$, $TaB_x$, Ti, TiN, $TiC_x$, $TiB_x$, Nb, NbN, $NbC_x$, $NbB_x$Mo, MoN, $MoC_x$, $MoB_x$, W, WN, $WC_x$, $WB_x$, V, Cr, Fe, Cu, Co, Ni, Cd, Zn, Al, Ag, Au, Ru, $RuO_x$, Rh, $RuO_x$, Pt, $PtO_x$, Pd, $PdO_x$, Re, $ReO_x$, Ir, $IrO_x$, Os and $OsO_x$ and mixtures thereof. Further, the substrate surface may have been patterned and may comprise structures such as nodes, vias and trenches.

The substrate may be treated prior to deposition of the activation layer. For example, the substrate may be treated to provide a surface that is reactive with one or more reactants that will be used to form the activation layer. In some embodiments the substrate surface may be treated to be reactive with an activation reactant that is printed on the surface.

The surface may also be treated to inhibit deposition. For example, in some embodiments at least a portion of the substrate surface is treated such that subsequent vapor phase deposition is inhibited on areas that do not contain the activation layer.

The activation layer is preferably deposited on the substrate using an imprint technique in which a patterned stamp is coated with an activation material and then contacted with the substrate surface. Microcontact printing can be used when electron-beam induced deposition is not available. Imprint techniques are low cost, high throughput and high resolution methods of fabricating nanometer scale patterns. A variety of types of imprint techniques processes are known and particular methods can be readily adapted to use to form an activation layer on a substrate as disclosed herein.

In some embodiments transfer imprint lithography methods, such as microcontact printing, are used to transfer a pattern of an activation material to a substrate. The stamp is typically made by using a hard master, such as a patterned Si wafer or patterned thin film structure, on top of which PDMS is casted and after curing peeled off. The stamp containing the desired template is immersed in liquid containing the activation layer reactant. The activation layer reactant is then printed on the substrate by contacting the stamp with the substrate so that the activation material is deposited on the substrate in areas where the stamp is in contact with the substrate. This technique produces a flat, nano-patterned chemical on the substrate surface.

In one embodiment for printing a layer of an activation material on a substrate a stamp is first coated with an activation material. Excess activation material is removed in the second step such that a coated stamp, comprising a layer of activation material that follows the pattern of the stamp is formed. The coated stamp is contacted with a substrate in a third step, and the activation material is transferred to the substrate from the stamp in areas where the stamp is in contact with the substrate.

Figure 1:
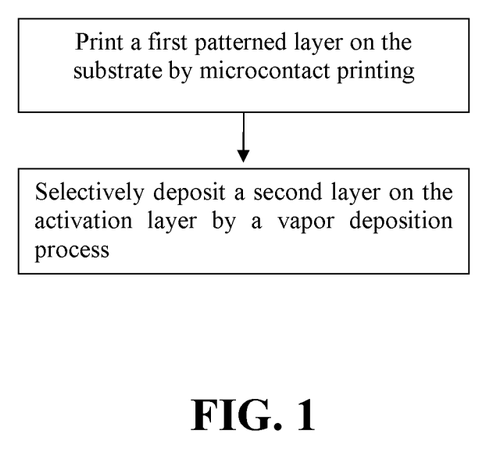
FIG. 1 is a flow chart generally illustrating a method for forming a patterned thin film in accordance with one embodiment.

In one embodiment for a method 10 for selectively depositing a thin film on a substrate is provided. The first step is to print a first patterned layer on the substrate by microcontact printing 11. The next step is to selectively depositing a second layer on the activation layer by a vapor deposition process 12.

In some embodiments, the substrate surface that is contacted with the activation layer reactant is such that the activation layer reactant adheres to the substrate surface in the pattern of the stamp. For example, in some embodiments a silicon substrate may comprise a native oxide to which an activation layer reactant will adhere during printing. The nature of adhesion of the activation layer reactant to substrate can be a chemical reaction or just physical adhesion forces. If the stamp is flat, the activation layer is transferred only in points of contacts, that is, to the top surface but not in any areas in trenches or holes.

The activation layer may be formed in a single step by depositing a single activation material in a desired pattern on the substrate, such as by printing, where the deposited activation material forms the activation layer without further processing. For example, with halide-terminated surfaces, preferably metal halide terminated surfaces, the deposited activation material can form the activation layer without further processing. However, in some embodiments a first activation material that is deposited on the substrate in the desired pattern needs to be processed further to form the activation layer. Thus, following printing of the activation material on the substrate, the patterned activation material may be treated, if required, to form an activation layer on which subsequent deposition will occur. Treatment may comprise, for example, an annealing step or a subsequent reaction step in which the deposited, patterned activation material is reacted with one or more additional reactants. For example, the patterned activation material may be oxidized. In some embodiments a second printing step can be used. The second printing step may require careful alignment of the two prints. In some embodiments treatments, such as annealing in different atmospheres, are performed. The different atmospheres can include, for example, reducing, nitriding or oxiding atmospheres. In some embodiments a metal compound serves as the first activation reactant and is printed on a substrate in a desired pattern. The patterned metal compound on the substrate is subsequently oxidized to form a metal oxide activation layer.

The reaction conditions at which the deposition of the activation layer is carried out are selected to facilitate formation of a distinct, patterned activation layer. In some embodiments, the printing temperature may be selected to facilitate adhesion of the activation reactant to the substrate surface in the pattern of the stamp. As a result, the printing temperature may be different for different types of substrate surfaces and different activation materials. The printing temperature is independent of the temperature at which the subsequent vapor deposition is carried out. In some embodiments the printing is done in-situ i.e. without air exposure or air break in between the stamping and vapor deposition process.

As mentioned above, depending on the nature of the activation layer reactant to be printed and the subsequent vapor deposition process, it may be beneficial to modify the substrate surface prior to printing. In some embodiments the substrate surface is modified to provide a surface to which the activation layer reactant will adhere. For example, the substrate surface may be exposed to an oxidizing material, such as ozone or air, to form a layer of oxide on the substrate surface.

The substrate surface may also optionally be modified to inhibit subsequent deposition on areas where the activation layer is not printed, thereby facilitating selective deposition. For example, in some embodiments the surface is treated to provide a low k insulating material on which deposition of a metal-containing film is disfavored. Appropriate surface treatment conditions can be determined by the skilled artisan in view of the particular activation materials and deposition processes being used. In some embodiments such a surface treatment is performed prior to depositing the activation layer. However, in some embodiments the surface may be treated following printing of an activation reactant or following complete formation of the activation layer. In some embodiments, the substrate surface may be modified more than one time prior to the vapor deposition step. For example, the substrate surface may be modified a first time to facilitate printing of an activation material, and modified a second time during processing of the first activation material to form an activation layer.

Once the activation layer is formed, a film of a desired composition and thickness is deposited over the activation layer by a vapor deposition process. Although generally described herein in relation to ALD processes, the skilled artisan will recognize that other deposition processes, such as chemical vapor deposition (CVD) type processes, may be used. The reaction conditions for the deposition may be selected to facilitate selective deposition on the activation layer relative to other portions of the substrate. For example, in embodiments in which ruthenium is deposited on patterned $RuO_2$, the temperature may be about 250° C. because at that temperature ruthenium grows preferentially on activated areas ($RuO_2$) and not on a Si substrate.

The activation layer is reactive with one or more of the reactants used in the vapor deposition process, while at least a second substrate surface is either not reactive or less reactive, such that deposition occurs selectively on the activation layer and a film with the pattern of the activation layer is formed. The activation layer can work to facilitate selective deposition in any of a variety of ways. For example, in some embodiments the activation layer may enhance nucleation of a deposition reactant. In other embodiments the activation layer can allow lower deposition temperatures to be used such that deposition is achieved on the activation layer relative to the remainder of the substrate. In some embodiments, the activation layer may react with one of the reactants. In some embodiments the activation layer may catalyze the reactions by activating one of the reactants, for example the dissociation of $H_2$ to atomic hydrogen. The activation layer may only be necessary for initiation of the vapor deposition process and, once the process has begun, deposition may continue for as long as desired, even if the activation layer (as initially deposited) is no longer accessible to the reactants. For example, the initial rounds of an ALD process may be facilitated by the reaction between one or more of the ALD reactants with the activation layer, but subsequent rounds of selective ALD may proceed even if the activation layer becomes covered by the deposited film because the film itself serves as a reactant and/or catalyst for the ALD reactants. Selective ALD will continue if the deposited material is selective on top of the material itself versus the second non-reactive surface.

In some embodiments deposition on the activation layer is selective relative to one or more surfaces comprising silicon, silicon oxide, a hydrophobic material or a dielectric material. In some preferred embodiments selective deposition is such that the desired film is deposited only on the activation layer. However, the skilled artisan will recognize that some small amount of deposition may occur on other surfaces. In some embodiments the desired film is deposited preferentially on the activation layer. That is, deposition occurs to a greater extent and/or more rapidly on the activation layer relative to a second surface of the substrate. In some embodiments the amount of deposition that occurs on one or more surfaces other than the activation layer is not significant enough to change one or more properties of the surface. In some embodiments, deposition that has occurred on areas outside of the activation layer may be removed in further processing, such as by etching. In some embodiments, short etching process could remove all deposition from the non-desired areas but still leave a continuous film on the activated and desired area. Such a blanket etch, such as a vapor etch or wet etch, can inexpensively accomplish full selectivity in the result even if the deposition is imperfectly selective, without the need for expensive masking processes. In some embodiments the deposition that has occurred outside the activation layer, in terms of thickness or mass of material per surface area, is preferably less than about 20%, more preferably less than about 10% and most preferably less than about 5% of the deposition that has occurred in the activated area. In some embodiments the deposition that has occurred outside the activation layer can be less than about 1%. The deposition occurred in the activated area versus areas outside activation can be measured, for example, by measuring thicknesses of the films or atomic densities of the films.

Although primarily illustrated herein in terms of deposition of ruthenium on a ruthenium oxide activation layer, the skilled artisan will recognize that other combinations of activation layers and metal-containing films can be used. In some embodiments both the activation layer and the layer that is deposited by vapor deposition over the activation layer comprise a metal. In some embodiments the activation layer does not contain metal or semimetal and the layer that is deposited by vapor deposition over the activation layer comprises a metal or semimetal. In some embodiments the activation layer comprises a noble metal or noble metal oxide and the layer deposited on the activation layer comprises a noble metal. In some embodiments the activation layer comprises a transition metal or transition metal oxide and a transition metal-containing layer is deposited over the activation layer.

In some embodiments at least one metal in the activation layer and at least one metal in the layer deposited over the activation layer are the same. For example, both the activation layer and the overlying film may both comprise ruthenium. In some embodiments at least one metal in the activation layer and at least one metal in the layer deposited over the activation layer are different.

In some embodiments, the patterned activation layer comprises a metal halide. In some embodiments a patterned metalorganic activation layer is used. The metal halide or metalorganic surface is preferably more reactive with a vapor deposition precursor than the remaining portions of the substrate. For example, the remaining portions of the substrate may comprise metal oxide or metal nitride.

Following deposition of the patterned activation layer, metal-containing thin films, including ruthenium thin films and thin films of other noble metals and transition metals can be deposited selectively on the activation layer on the substrate by vapor deposition processes, such as atomic layer deposition (ALD) or chemical vapor deposition (CVD) type processes.

In some embodiments the printed activation layer comprises a high-k material, a metal nitride or a metal. At temperatures less than 450° C., some materials, such as noble metals, are readily deposited by ALD on high-k materials, metal nitrides and metals. However, they are not readily deposited on lower k materials, such as silicon oxides and silicon nitrides. Thus, in particular embodiments, a metal-containing film is selectively deposited on a first surface, the patterned activation layer, comprising a high-k material while avoiding deposition on a second surface comprising a lower k insulator such as a silicon oxide, silicon nitride, silicon oxynitride, fluorinated silica glass (FSG), carbon doped silicon oxide (SiOC) or material containing more than 50% of silicon oxide. In some embodiments the printed activation layer comprises a transition metal. In some embodiments the printed activation layer comprises a transition metal oxide. In some embodiments the printed activation layer comprises a transition metal nitride.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta2O_5$, lanthanide oxides and mixtures thereof, silicates and materials such as YSZ (yttria-stabilized zirconia), BST (barium-strontium titanate), BT (barium titanate), ST (strontium titanate), and SBT (strontium bismuth tantalate).

In some embodiments the metal-containing thin film is selectively deposited on a patterned activation layer comprising a metal, metal nitride, metal carbide, metal boride or mixtures thereof, while avoiding deposition on a second surface comprising an insulating material.

In some embodiments the activation layer comprises a metal, metal oxide, metal carbide, metal boride or metal nitride selected from the group consisting of Ta, TaN, $TaC_x$, $TaB_x$, Ti, TiN, $TiC_x$, $TiB_x$, Nb, NbN, $NbC_x$, $NbB_x$ Mo, MoN, $MoC_x$, $MoB_x$, W, WN, $WC_x$, $WB_x$, V, Cr, Fe, Cu, Co, Ni, Cd, Zn, Al, Ag, Au, Ru, $RuO_x$, Rh, $RhO_x$, Pt, $PtO_x$, Pd, $PdO_x$, Re, $ReO_x$, Ir, $IrO_x$, Os and $OsO_x$ and mixtures thereof.

In some embodiments the thin film comprises one or more noble metals. Noble metals are well known in the art and include, for example, Ru, Rh, Pd, Ag, Re, Os, Ir, Au and Pt. Suitable noble metal precursors may be selected by the skilled artisan. In some embodiments the thin films is an oxide of the above mentioned noble metals.

ALD type deposition processes are used in some embodiments to deposit the desired film over the activation layer. ALD type processes are based on controlled, self-limiting surface reactions of the precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge.

Briefly, the substrate comprising the printed activation layer is loaded in a reaction chamber and is heated to a suitable deposition temperature, generally at lowered pressure. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the nature of the activation layer and the reactant species involved.

Each ALD cycle comprises alternating and sequential provision of a first and second reactant. A first reactant is conducted into the chamber in the form of vapor phase pulse and contacted with the surface of the substrate. Conditions are selected such that no more than about one monolayer of the precursor is adsorbed on the substrate surface in a self-limiting manner, selectively on the activation layer. While some deposition may take place on other areas of the substrate, more deposition takes place on the activation layer relative to the other areas. In some embodiments deposition takes place exclusively on the patterned activation layer.

Excess first reactant and reaction byproducts, if any, are purged from the reaction chamber, often with a pulse of inert gas such as nitrogen or argon.

A second gaseous reactant is pulsed into the chamber where it reacts with the first reactant bound to the surface. Excess second reactant and gaseous by-products of the surface reaction are removed from the reaction chamber, preferably purged with the aid of an inert gas. The steps of pulsing and purging are repeated until a thin film of the desired thickness has been selectively formed on the substrate, with each cycle leaving no more than a molecular monolayer. Depending on the composition of the film to be formed, additional pulsing and purging steps may be included in each ALD cycle, or at particular intervals in the ALD process.

As mentioned above, each pulse or phase of each cycle is preferably self-limiting. An excess of reactant precursors is supplied in each phase to saturate the susceptible substrate surfaces. Surface saturation ensures reactant occupation of all available reactive sites (subject, for example, to physical size or "steric hindrance" restraints) and thus excellent step coverage.

According to some embodiments, a patterned activation layer is formed on a substrate and a thin film comprising a metal is selectively deposited on the patterned activation layer by an ALD type process comprising multiple pulsing cycles, each cycle comprising:

pulsing a vaporized metal precursor into the reaction chamber to selectively form a molecular layer of the metal precursor on the patterned activation layer on the substrate, purging the reaction chamber to remove excess metal precursor and reaction by products, if any, providing a pulse of a second reactant, such as an oxygen, ozone, ammonia or ammonia plasma containing gas onto the substrate; and purging the reaction chamber to remove excess second reactant and any gaseous by-products formed in the reaction between the metal precursor layer on the activation layer and the second reactant.

The pulsing and purging cycle is repeated until a thin film of the desired thickness has been formed preferentially over the activation layer. The skilled artisan will appreciate that the ALD cycle can be modified to deposit a film with the desired composition. The thin film that is deposited over the activation layer typically comprises multiple monolayers of a single composition. However, in other embodiments, the final thin film may comprise two or more different compositions. For example, the growth can be started with the deposition of a first composition and ended with the deposition of a second composition. In some embodiments the film may be a graded film. In still other embodiments the thin film is a nanolaminate.

The preferred precursors will have an increased reactivity with the activation layer relative to other materials on the substrate surface.

In some embodiments noble metal precursors may be cyclopentadienyl, 2,2,6,6-tetramethyl-3,5-heptanedionato (thd) and acetylacetonate (acac) precursor compounds. In some embodiments a bis(ethylcyclopentadienyl) noble metal compound is used.

When depositing ruthenium thin films, preferred metal precursors may be selected from the group consisting of bis(cyclopentadienyl)ruthenium, tris(2,2,6,6-tetramethyl-3,5-heptanedionato)ruthenium and tris(N,N'-diisopropylacetamidinato)ruthenium(III) and their derivatives, such as bis(N,N'-diisopropylacetamidinato)ruthenium(II) dicarbonyl, bis(ethylcyclopentadienyl)ruthenium, bis(pentamethylcyclopentadienyl)ruthenium, 2,4-(dimethylpentadienyl)(ethylcyclopentadienyl)ruthenium ($Ru[(CH_3)_2C_5H_5)(EtCp)]$) and bis(2,2,6,6-tetramethyl-3,5-heptanedionato)(1,5-cyclooctadiene)ruthenium(II) and derivatives of those. In preferred embodiments, the precursor is bis(ethylcyclopentadienyl)ruthenium ($Ru[EtCp]_2$).

When depositing platinum films, preferred metal precursors include (trimethyl)methylcyclopentadienylplatinum, platinum (II) acetylacetonato, bis(2,2,6,6-tetramethyl-3,5-heptanedionato)platinum(II) and their derivatives.

When depositing iridium films, preferred metal precursor include tris(acetylacetonato)iridium(III), tris(2,2,6,6-tetramethyl-3,5-heptanedionato)iridium(III), (methylcyclopentadienyl)iridium(1,3-cyclohexadiene) and derivates of those.

When depositing palladium films, preferred metal precursors include bis(hexafluoroacetylacetonate)palladium(II), $Pd(acac)_2$ and $Pd(thd)_2$ and derivatives of those.

A noble metal ALD process typically comprises alternating pulses of a noble metal precursor and an oxygen-containing reactant. The oxygen-containing reactant pulse may be provided, for example, by pulsing diatomic oxygen gas or a mixture of oxygen and another gas into the reaction chamber. In other embodiments, oxygen is formed inside the reactor, such as by decomposing oxygen containing chemicals. Oxygen containing chemicals that can be decomposed in the reactor to produce oxygen include, without limitation, $H_2O_2$, $N_2O$ and organic peroxides. Mixtures of such chemicals can also be used. In other embodiment, the catalytical formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium.

In some embodiments an oxygen-containing reagent comprises free-oxygen or ozone, more preferably molecular oxygen. The oxygen-containing reagent may be pure molecular diatomic oxygen, but can also be a mixture of oxygen and inactive gas, for example, nitrogen or argon. A preferred oxygen-containing reagent is air.

In some embodiments, such as in the deposition of a noble metal on an activation layer comprising a high-k material, radicals are not used in the ALD process. Rather than a plasma enhanced ALD process, a thermal ALD process is used.

The metal precursor employed in the vapor deposition processes may be solid, liquid or gaseous material, provided that the metal precursor is in vapor phase before it is conducted into the reaction chamber and contacted with the substrate surface. "Pulsing" a vaporized precursor onto the substrate means that the precursor vapor is conducted into the chamber for a limited period of time. Typically, for single wafer processing the pulsing time is from about 0.05 to 10 seconds. However, depending on the substrate type and its surface area, the pulsing time may be even higher than 10 seconds. For example, for batch reactors pulse times may range from milliseconds to minutes or longer. Preferably, for a 300 mm wafer in a single wafer ALD reactor, the noble metal precursor is pulsed for from 0.05 to 10 seconds, more preferably for from 0.5 to 3 seconds and most preferably for about 0.5 to 1.0 seconds. The oxygen-containing precursor is preferably pulsed for from about 0.05 to 10 seconds, more preferably for from 1 to 5 seconds, most preferably about for from 2 to 3 seconds, but it can be in order of minutes in some cases.

Examples of suitable reactors that may be used for the deposition of thin films include commercially available ALD equipment, such as the F-120® reactor, Pulsar® reactor and EmerALD™ reactor, available from ASM America, Inc of Phoenix, Ariz. In addition to these ALD reactors, many other kinds of reactors capable of ALD growth of thin films, including CVD reactors equipped with appropriate equipment and means for pulsing the precursors, can be employed for carrying out the processes of the present invention. Preferably, reactants are kept separate until reaching the reaction chamber, such that shared lines for the precursors are minimized. However, other arrangements are possible, such as the use of a pre-reaction chamber as described in U.S. application Ser. No. 10/929,348, filed Aug. 30, 2004 and Ser. No. 09/836,674, filed Apr. 16, 2001, incorporated herein by reference.

The growth processes can optionally be carried out in a reactor or reaction space connected to a cluster tool. In a cluster tool, because each reaction space is dedicated to one type of process, the temperature of the reaction space in each module can be kept constant, which clearly improves the throughput compared to a reactor in which is the substrate is heated up to the process temperature before each run. In addition, pump time is saved if the transfer area behind a load lock is maintained at a low base pressure.

In some embodiments CVD type processes are used to deposit a desired material on the activation layer.

Before starting the deposition of the film over the activation layer, the substrate is typically heated to a suitable growth temperature. The preferred growth temperature will depend on the nature of the reaction, the nature of the adhesion layer and the nature of the remaining surfaces of the substrate on which deposition is to be avoided. In some embodiments the growth temperature of the metal thin film is between about 50° C. and about 500° C., more preferably between about 100° C. and about 400° C. and most preferably between about 150° C. and about 350° C. The preferred deposition temperature may also vary depending on factors such as, and without limitation, the reactant precursors, the pressure, flow rate, and the arrangement of the reactor. The specific growth temperature may be selected by the skilled artisan using routine experimentation to maximize the selectivity of the process.

The processing time depends on the nature of the vapor deposition process, the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, more preferably between about 1 and 10 seconds, but it can be in order of minutes or more in some cases. For example, longer processing times may be employed in batch processing.

As mentioned above, the noble metal ALD process typically comprises alternating pulses of noble metal precursor and an oxygen-containing reactant. The oxygen-containing reactant pulse may be provided, for example, by pulsing diatomic oxygen gas or a mixture of oxygen and another gas into the reaction chamber. In one embodiment, ammonia plasma or ammonia is used as a second reactant. In some embodiments, atomic hydrogen, hydrogen radicals or hydrogen plasma is used as a second reactant. In other embodiments, oxygen is formed inside the reactor, such as by decomposing oxygen containing chemicals. Oxygen containing chemicals that can be decomposed in the reactor to produce oxygen include, without limitation, $H_2O_2$, $N_2O$ and organic peroxides. Mixtures of such chemicals can also be used. In other embodiments, the catalytic formation of an oxygen containing pulse can be provided by introducing into the reactor a pulse of vaporized aqueous solution of $H_2O_2$ and conducting the pulse over a catalytic surface inside the reactor and thereafter into the reaction chamber. The catalytic surface is preferably a piece of platinum or palladium.

In preferred embodiments the oxygen-containing reagent comprises free-oxygen or ozone, more preferably molecular oxygen. The oxygen-containing reagent is preferably pure molecular diatomic oxygen, but can also be a mixture of oxygen and inactive gas, for example, nitrogen or argon. In some embodiments the oxygen containing reagent contains atomic oxygen, oxygen radicals or oxygen plasma.

A preferred oxygen-containing reagent is air.

Metal precursors employed in the vapor deposition processes may be solid, liquid or gaseous material, provided that the metal precursor is in vapor phase before it is conducted into the reaction chamber and contacted with the substrate surface.

In some particular embodiments a $RuO_2$ film is printed on a substrate by a microcontact printing process to form an activation layer. Briefly, an $RuCl_3$ ethanol solution is printed on the silicon substrate in the desired pattern using a stamp. After printings the substrate may be exposed to ozone or another oxidant such that that patterned $RuO_2$ film is formed on the substrate. The $RuO_2$ layer may contain other elements. In some embodiments the $RuO_2$ layer may contain $RuO_x$ or even $RuO_x(OH)_yCl_z$. The $RuO_2$ layer serves as an activation layer for subsequent vapor deposition of ruthenium, such as ruthenium ALD from $RuCp_2$ and air. $RuO_2$ can be used as surface activation layer due to its oxidizing properties. $RuCp_2$ has a high reactivity to oxygen which allows the $RuCp_2$ precursor to bind to the $RuO_2$ on the substrate. Aaltonen, T.; Rahtu, A.; Ritala, M.; Leskelä, M. *Electrochem Solid State Letters* 2003, 6.

Examples $RuO_2$ activation layers were studied for selective-area ALD of ruthenium. As discussed in more detail below, ruthenium films were deposited on patterned $RuO_2$ activation layers at about 250° C. Patterned $RuO_2$ activation layers were prepared by two step process. First, a $RuCl_3$ layer was microcontact printed to a silicon surface using a PDMS stamp. Then the sample was exposed to ozone. Two types of stamps were used: stamps that produced 1.5 µm lines and stamps that produced 300-500 nm lines. The stamp features were transferred to the substrate and ruthenium film subsequently grew only on activated areas. The ruthenium film thickness on activated areas was about 19 nm after 1000 ruthenium ALD cycles.

$RuO_2$ as an Activation Layer for ALD Ruthenium Processes

Figure 3:
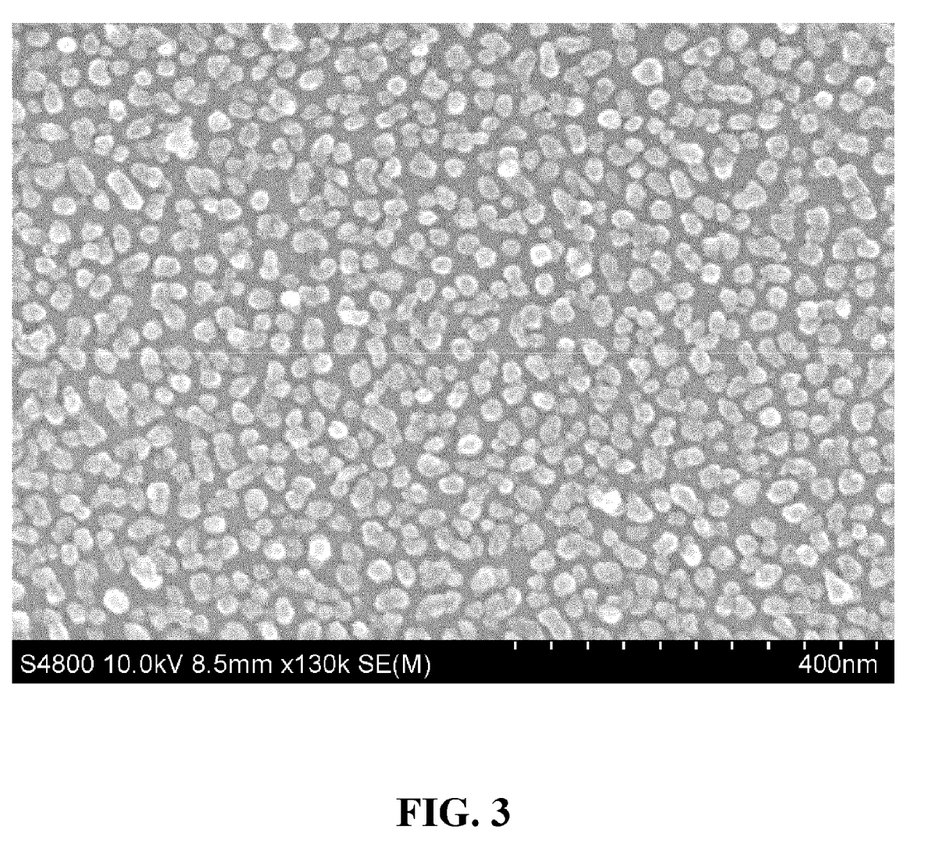
FIG. 3 is an SEM image of an $RuO_2$ activation layer.
Figure 4:
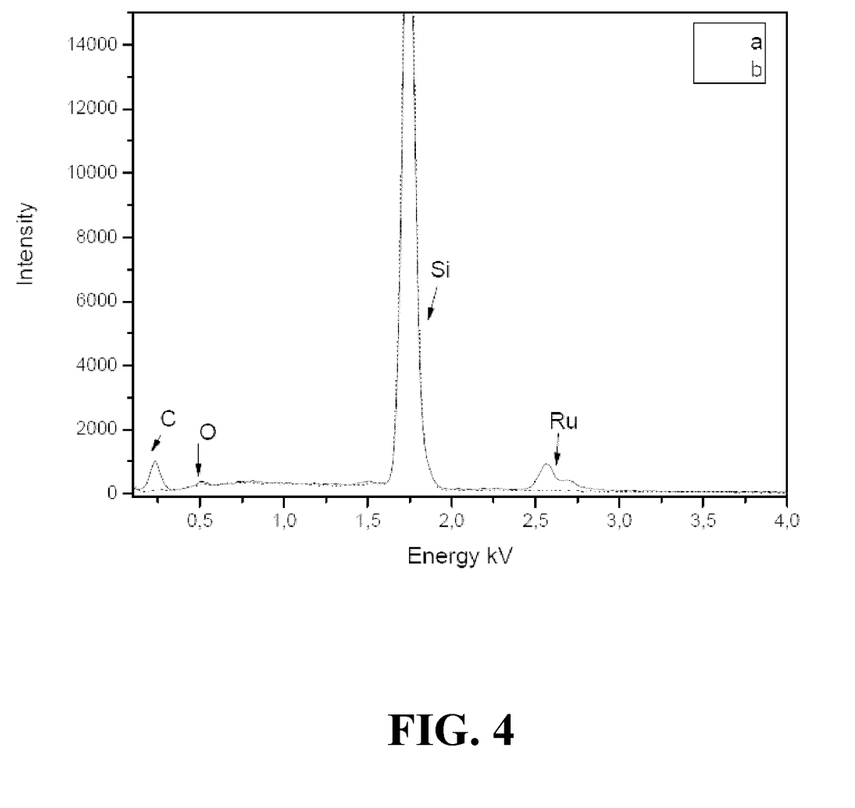
FIG. 4 illustrates the EDX spectra measured after ALD Ru was deposited on a sample which had a $RuO_2$ activation layer and on a sample with bare silicon.

To test the ruthenium deposition process at 250° C., unpatterned $RuO_2$ activation layers were prepared by SILAR (successive ionic layer adsorption and reaction process on silicon substrates—see for example Successive Ionic Layer Adsorption and Reaction (SILAR) and Related Sequential Solution-Phase Deposition Techniques by Lindroos, S. & Leskelä, M. 2009 Solution Processing of Inorganic Materials. Mitzi, D. B. (ed.). Hoboken, N.J.: Wiley p. 239-282). A silicon (100) substrate was initially immersed in $RuCl_3$ water solution (10 mM) for 30 s. After cation immersion the substrate was rinsed for 5 s in purified water. The cycle was completed by immersing the substrate in $H_2O$ at 65° C. for 60 s. Cycle numbers for $RuO_2$ were 1, 5 and 25 cycles and an overlying ruthenium film was deposited by ALD on the activation layers for 1000 cycles. FIG. 3 is an SEM image of a $RuO_2$ activation layer deposited for 25 cycles. In FIG. 4 EDX is measured after ALD of ruthenium on a sample which had a $RuO_2$ activation layer prepared by 5 cycles and on bare silicon.

Ruthenium films can be deposited by ALD from $RuCp_2$ and air at a temperature range of about 275-400° C. on $Al_2O_3$ and $TiO_2$ covered silicon substrates, but when the substrate is covered by an activation layer, lower deposition temperatures can also be used. Therefore the temperature of the ruthenium process for selective-area ALD purposes was selected to be 250° C. so that the ruthenium film would grow only on the $RuO_2$ activation layer but not on native oxide covered silicon.

Ruthenium was deposited on the $RuO_2$ adhesion layers by ALD from $RuCp_2$ (Cp=cyclopentadienyl) and air at 250° C. for 1000 cycles. The ALD films were grown in an F120 reactor (ASM Microchemistry, Ltd., Finland). Nitrogen was used as a carrier and purging gas. The reactor was operated at pressures of about 10 mbar.

EDX measurements showed that ruthenium film grew only on $RuO_2$ areas, not on silicon. The thickness of ruthenium films after 1000 cycles was measured to be 17 nm. The same thickness of ruthenium film was measured on a $RuO_2$ activation layer prepared by 1 SILAR cycle. This indicates that 1 cycle of $RuO_2$ is enough to prepare an activation layer.

Patterned $RuO_2$ as an Activation Layer for ALD Ruthenium Processes

The first step of preparing patterned $RuO_2$ activation layers was the printing of $RuCl_3$ on a substrate using a stamp. In particular, patterned activation layers were prepared by microcontact printing using a PDMS stamp. The PDMS stamp was prepared from 10:1 (weight:weight) mixture of SYLGARD silicone elastomer 184 and SYLGARD silicone elastomer 184 curing agent. The components were mixed and let to set for 30 minutes. The polymer was poured onto a master to a thickness of about 5 mm. The first hour of the curing was done at room temperature and the second hour at 80° C. The PDMS stamp was allowed to cool to room temperature before it was removed from the master and cut to the right size.

Figure 2A:
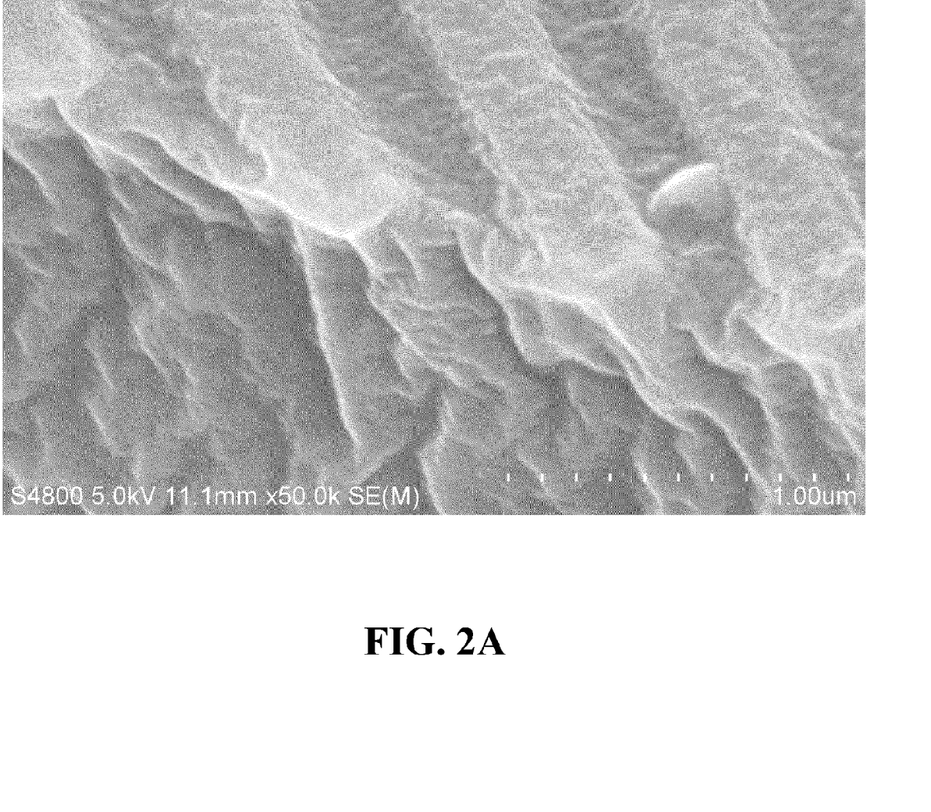
FIG. 2A is an SEM image of a stamp with 300 nm wide lines.
Figure 2B:
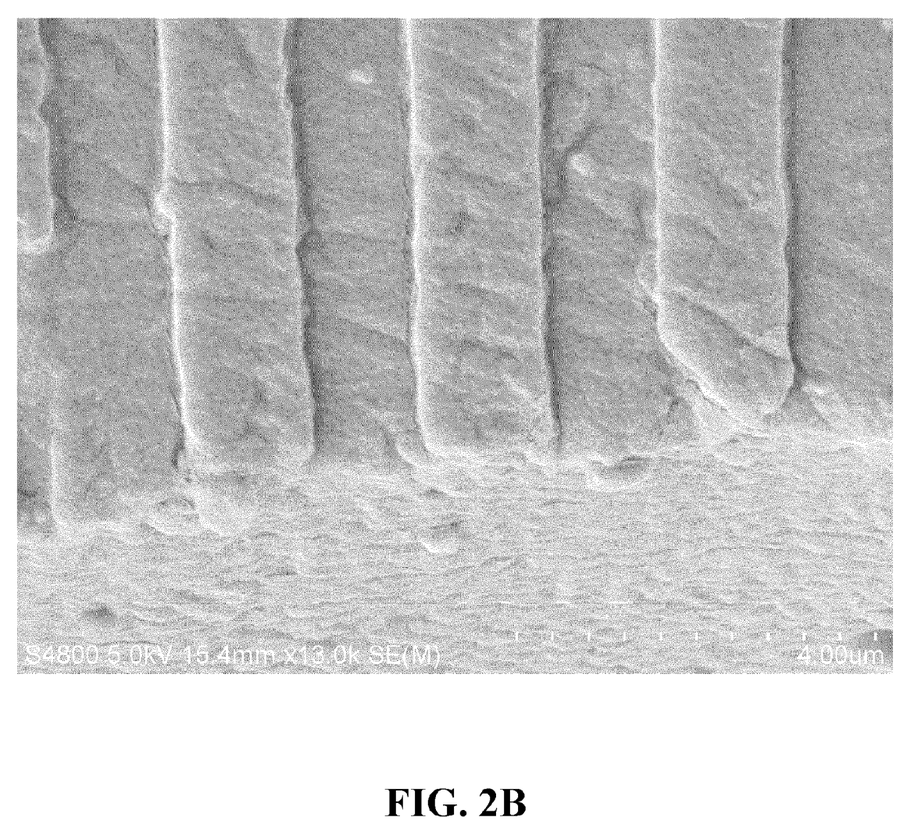
FIG. 2B is an SEM image of a stamp with 1.5 µm lines.

The PDMS stamps were cast in two different masters. A stamp with 300 nm wide lines (FIG. 2A) was prepared from a master that in turn was prepared from a blank commercial DVD disk. A stamp with 1.5 µm lines (FIG. 2B) was prepared from a master that was made lithographically from nickel. The depth of the structure in the DVD master was about 150 nm and in the nickel master was about 570 nm. The DVD master was used only once but the nickel master was used for several stamp preparations.

PDMS stamps easily absorb nonpolar organic solvents but because here the solvent was ethanol, the hydrophobic PDMS stamp was treated to make it more hydrophilic so that it can absorb the polar precursor solution more easily. Thus, before printing the stamps were held under UV lamp (264/185 nm, 10 W) for 6 h to make them hydrophilic. The water contact angle measured on a non patterned surface of a new PDMS stamp was about 95-105°. After the 6 h UV treatment the contact angle decreased to 30-60°. If the water contact angle of a stamp was over 60° before printing, it was observed that in many cases the features of a stamp were not transferred on a substrate. This could be because the stamp was not hydrophilic enough and thus could not absorb the $RuCl_3$ ethanol solution. Therefore, if the contact angle was higher than 60° a stamp was not used for printings. If the stamp was not used immediately it was stored in deionized water. Each stamp was used for one printing.

Patterned $RuO_2$ films were prepared by a two step process. First, a drop of $RuCl_3$ ethanol solution (2.5 mM) was put on the stamp for 60 s. The stamp was dried with compressed air for 5 s and placed in contact with the substrate within 10 s. Printing time was typically 15 s. The second step of the process was to place the sample for 2 h under a UV lamp (264/185 nm, 10 W) that produces ozone.

The imprint of the stamp could vary, especially with DVD stamp. Therefore stamps were used only once so that the previous printings did not affect the quality of a print. Also the master prepared from the DVD was used only for one stamp casting because PDMS traces may have remained in the master and could potentially change the dimensions of the next stamp.

Because the printings were done by hand, the printing force was different in each printing. This affected the width of the printed lines i.e. the $RuCl_3$ lines on the substrate could be wider than the lines in the stamp. This occurred mainly with the DVD stamp and was probably due to the shallow depth of the structure which was only 150 nm. Widths of the produced $RuO_2$ lines were 300-500 nm depending on the printing time. A similar issue was not observed with the stamp with 1.5 μm lines, probably because the structures in this stamp were deeper at 570 nm.

Figure 5:
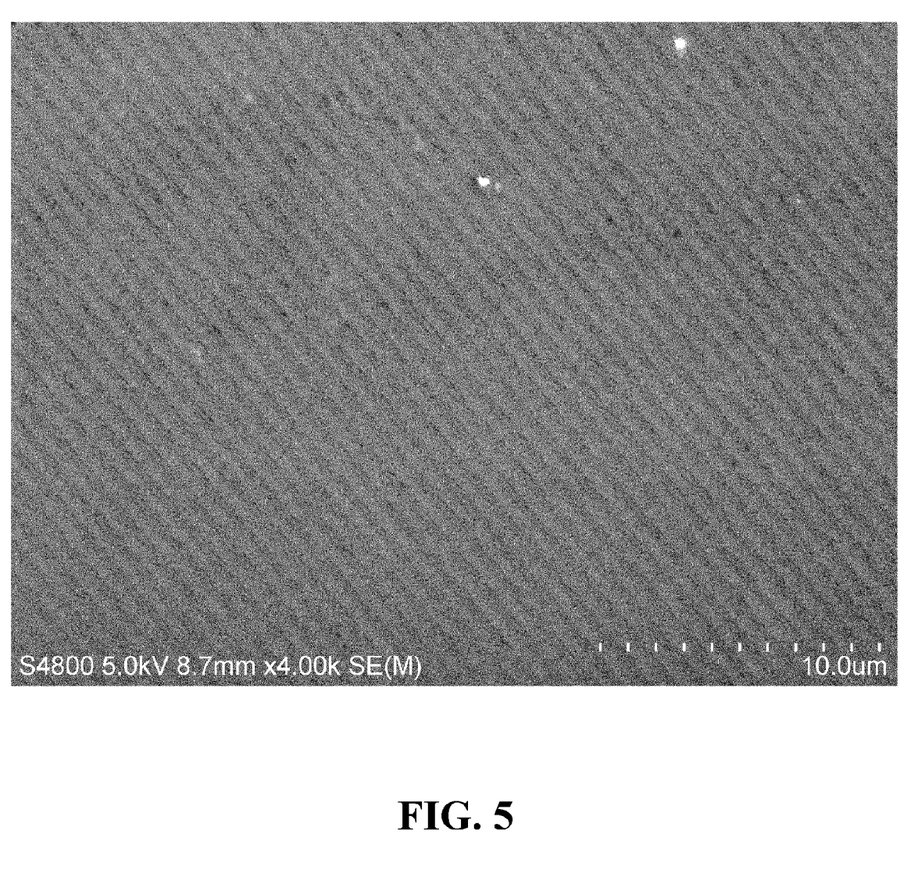
FIG. 5 is an SEM image of patterned $RuO_2$ films prepared by a stamp as shown in FIG. 2A.

The final step of preparing a patterned $RuO_2$ activation layer was exposing a substrate that had a patterned $RuCl_3$ layer to ozone. After the printing step, the sample was placed below a UV-lamp that produces ozone. FIG. 5 shows an SEM image of patterned $RuO_2$ film that was prepared by a DVD stamp from 2.5 mM $RuCl_3$ solution. The printing time of the $RuCl_3$ solution was about 15 s and ozone exposure time was about 2 h. $RuO_2$ lines can be seen in the image and the features of the stamp were well repeated on the substrate.

Figure 6A:
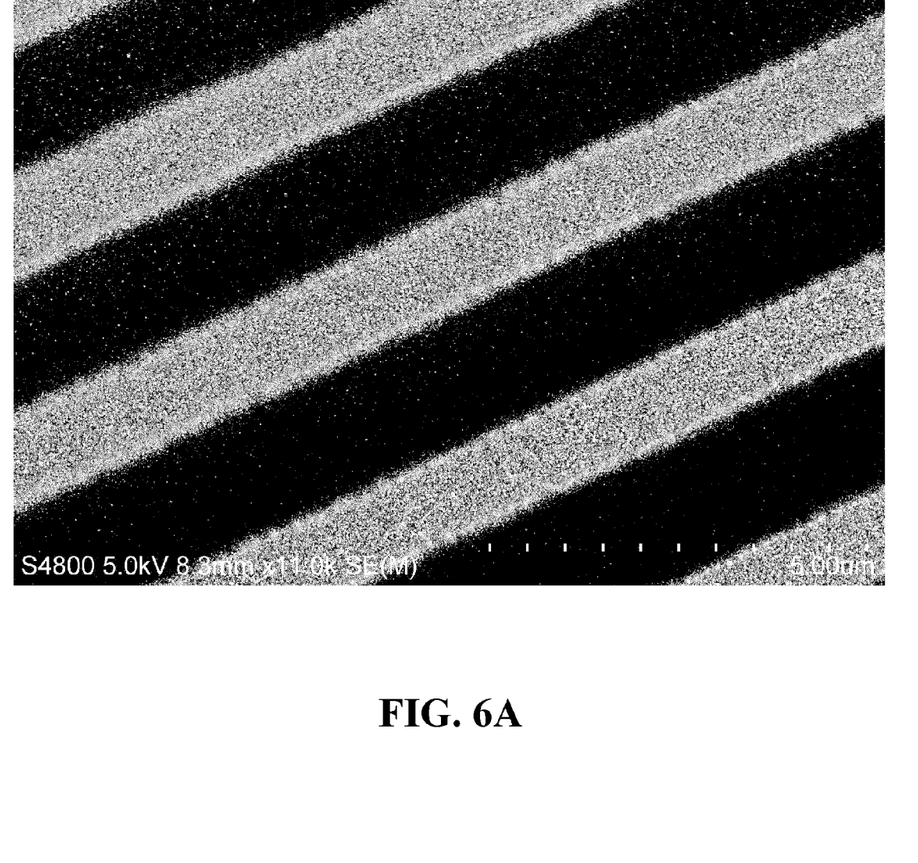
FIG. 6A is an SEM image of a patterned ruthenium film that was grown on a patterned activation layer prepared using a stamp with 1.5 µm lines.
Figure 6B:
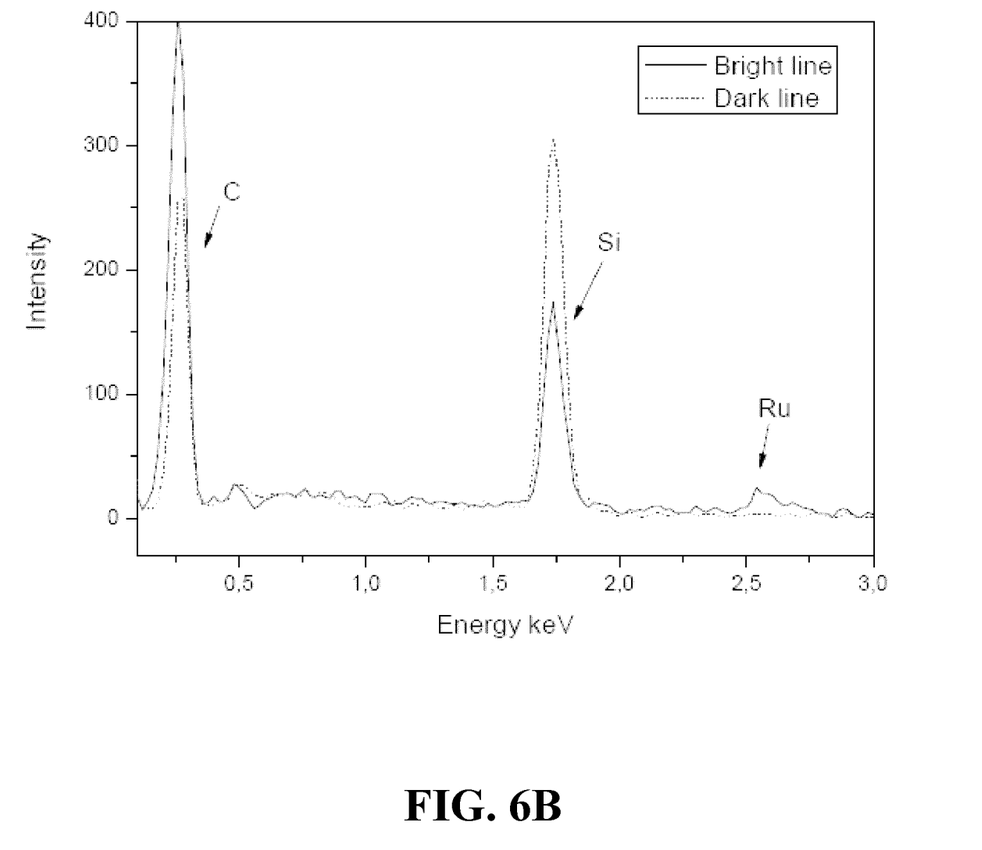
FIG. 6B illustrates EDX spectra measured on the bright and dark areas.

After preparation of a patterned activation layer, an ALD ruthenium film was deposited on the substrate for 1000 cycles at 250° C. FIG. 6A is an SEM image of a patterned ruthenium film that was grown on a patterned activation layer prepared by the stamp with 1.5 μm lines. EDX measurements proved that the bright areas are ruthenium and dark areas are without film (FIG. 6B). The ruthenium lines are 1.5 μm wide, demonstrating that the features of the PDMS stamp (FIG. 2B) are repeated on the substrate surface. The thickness of the ruthenium film was 19 nm as measured on activated area of the sample. The thickness is in accordance with the ruthenium thickness measured on activation layer prepared by the SILAR process for 1 cycle.

Figure 7A:
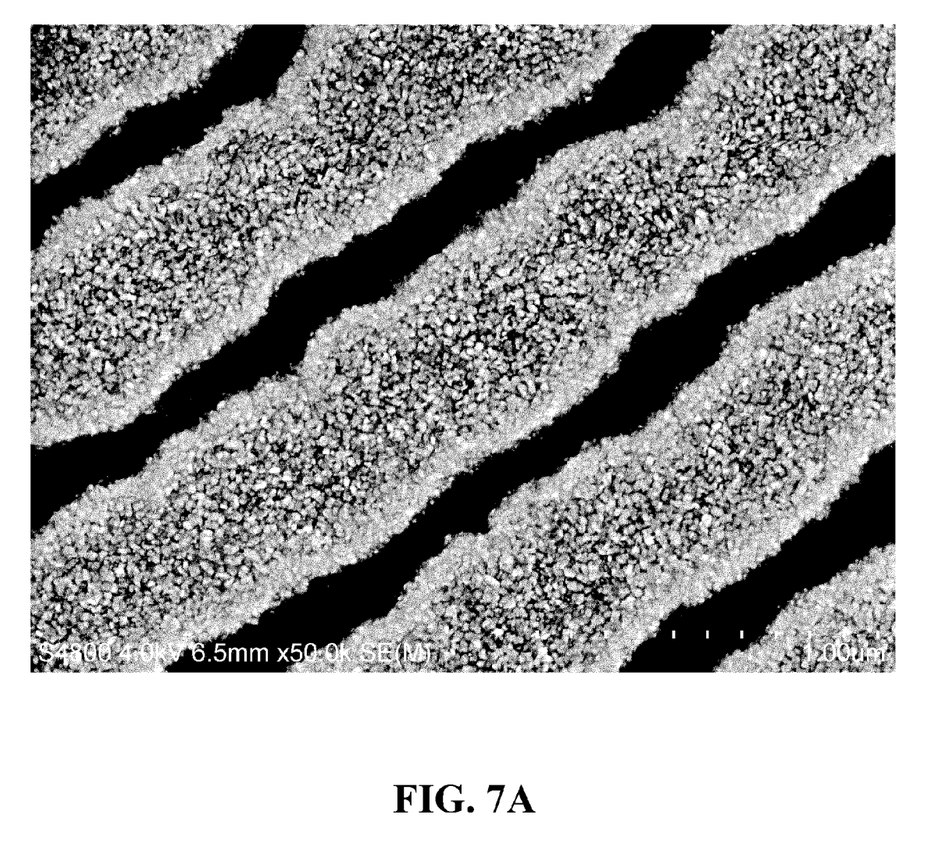
FIG. 7A is an SEM image of submicron ruthenium lines deposited on an activation layer prepared with a stamp as illustrated in FIG. 2A.
Figure 7B:
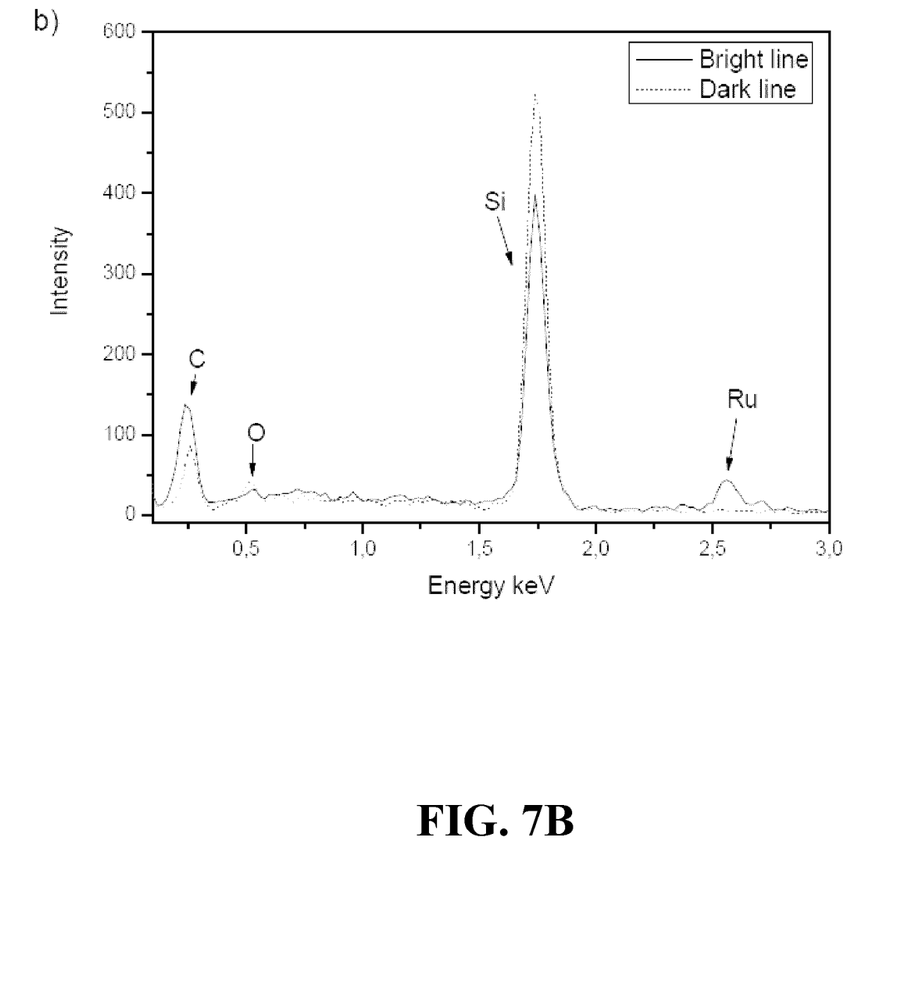
FIG. 7B shows an EDX spectrum confirming that there were about 200 nm wide silicon areas between ruthenium lines.

Submicron ruthenium lines were deposited on an activation layer prepared by the DVD stamp (FIG. 7A). The ruthenium lines were about 500 nm wide and there were about 200 nm wide silicon areas between the lines as confirmed by EDX (FIG. 7B). The w ruthenium lines were wider than the lines in the stamp. This is probably due to the shallow depth of the structures in the DVD stamp and the printing process, which was done by hand. A person skilled in the art will understand that printing by hand is a very crude way and with state-of-the-art microcontact printing tools one can do much better

What is claimed is:

1. A method for selectively depositing a thin film on a substrate comprising:
   printing a first layer consisting of a metal halide on the substrate by microcontact printing, wherein the first layer consisting of the metal halide is subsequently converted to a first inorganic activation layer; and
   subsequently selectively depositing a second layer on the first inorganic activation layer by a chemical vapor deposition process or an atomic layer deposition process, wherein the second layer consists essentially of an elemental metal or a metal alloy.

2. The method of claim 1, wherein the first inorganic activation layer is patterned.

3. The method of claim 1, wherein the first inorganic activation layer comprises a transition metal.

4. The method of claim 1, wherein the first inorganic activation layer comprises a transition metal oxide.

5. The method of claim 1, wherein the first inorganic activation layer comprises noble metal.

6. The method of claim 5, wherein the first inorganic activation layer comprises noble metal oxide.

7. The method of claim 1, wherein the second layer comprises a noble metal.

8. The method of claim 1, wherein printing comprises coating a stamp with the metal halide and contacting the substrate with the coated stamp such that the metal halide is transferred to the substrate.

9. The method of claim 1, wherein the first inorganic activation layer is a metal carbide, metal boride or metal nitride.

10. The method of claim 1, wherein the first inorganic activation layer is a dielectric material having a dielectric constant (k) value greater than 5.

11. A method for depositing a patterned thin film comprising:
    depositing a patterned layer consisting of a metal halide on a substrate by microcontact printing, wherein the patterned layer consisting of the metal halide is subsequently converted to a patterned inorganic activation layer; and
    depositing a second layer on the patterned inorganic activation layer by a chemical vapor deposition process or an atomic layer deposition process, wherein the second layer is selectively deposited on the inorganic patterned activation layer and wherein the second layer consists essentially of an elemental metal or a metal alloy.

12. The method of claim 11, wherein the second layer is deposited preferentially on the patterned inorganic activation layer relative to other areas of the substrate.

13. The method of claim 11, wherein microcontact printing comprises coating a patterned stamp with the metal halide and contacting the substrate with the coated stamp such that the metal halide is transferred to the substrate.

14. The method of claim 11, wherein the patterned inorganic activation layer and the second layer each comprise a metal.

15. The method of claim 14, wherein the metal is a noble metal or a transition metal.

16. The method of claim 11, wherein the patterned inorganic activation layer comprises a noble metal oxide and the second layer comprises a noble metal.

17. The method of claim 16, wherein the patterned inorganic activation layer comprises $RuO_2$ and the second layer comprises Ru.

* * * * *